United States Patent [19]

Kingon et al.

[11] Patent Number: 5,555,486
[45] Date of Patent: Sep. 10, 1996

[54] HYBRID METAL/METAL OXIDE ELECTRODES FOR FERROELECTRIC CAPACITORS

[75] Inventors: Angus I. Kingon, Cary, N.C.; Husam N. Al-Shareef, Albuquerque, N.M.; Orlando H. Auciello, Cary, N.C.; Ken D. Gifford, Raleigh, N.C.; Dan J. Lichtenwalner, Raleigh, N.C.; Rovindra Dat, Dallas, Tex.

[73] Assignee: North Carolina State University, Raleigh, N.C.

[21] Appl. No.: 365,781

[22] Filed: Dec. 29, 1994

[51] Int. Cl.⁶ .............................. H01G 4/008; H01G 4/10
[52] U.S. Cl. ................ 361/305; 361/301.1; 361/301.4; 361/313; 361/321.2; 361/306.3; 361/311; 361/298.3; 257/295; 257/303; 257/306; 257/310; 437/51; 437/52; 437/57; 437/60
[58] Field of Search ........................ 361/305, 313, 361/311, 321.2, 312, 301.4, 306.3, 298.3, 301.1; 257/295, 296, 300, 303, 304, 310, 352; 437/51, 52, 60, 57

[56] References Cited

U.S. PATENT DOCUMENTS

| | | | |
|---|---|---|---|
| 5,142,437 | 8/1992 | Kammerdiner et al. | 361/313 |
| 5,218,512 | 6/1993 | Nakamura | 361/321 |
| 5,262,920 | 11/1993 | Sakuma et al. | 361/321.5 |
| 5,270,298 | 12/1993 | Ramesh | 505/1 |

Primary Examiner—Leo P. Picard
Assistant Examiner—Anthony Dinkins
Attorney, Agent, or Firm—Bell, Seltzer, Park & Gibson

[57] ABSTRACT

Ferroelectric capacitors with hybrid electrodes including both a conducting oxide and a noble metal may be used to achieve devices having improved performance over capacitors with either platinum or ruthenium oxide electrodes. These hybrid electrode structures can improve capacitor performance both in terms of fatigue and leakage current. Accordingly, these ferroelectric capacitors with hybrid electrodes can be used as elements of an integrated circuit such as a non-volatile memory or dynamic random access memory.

46 Claims, 6 Drawing Sheets

HYBRID METAL/METAL OXIDE ELECTRODES FOR FERROELECTRIC CAPACITORS

This invention was made with Government support under contract No. N00014-93-1-0591 from the Advanced Research Projects Agency. The Government has certain rights to this invention.

FIELD OF THE INVENTION

This invention relates to capacitors and more particularly to capacitors having hybrid electrode structures.

BACKGROUND OF THE INVENTION

Lead zirconate titanate, $Pb(Zr_xTi_{1-x})O_3$ or PZT, ferroelectric thin film capacitors have been studied over the past few years as candidates for use in nonvolatile memories. The PZT capacitors are normally fabricated using either metal or oxide electrodes. The most commonly used metal electrode has been Pt, while the most commonly used oxide electrodes have been ruthenium oxide ($RuO_2$) and lanthanum strontium cobalt oxide ($La_{1-x}Sr_xCoO_3$). See, R. Ramesh et al., (1992), *J. Electronic Materials*, Vol. 23, p. 19, (1994); S. Bernstein et al., (1992), *J.Mater.Res.* 8,12; K. Bellur et al., (1992), *Proceedings of the Eighth International Symposium on Applications of Ferroelectrics*, IEEE publication No. 92CH3080-9, pp 448; D. Vijay et al., (1992), *Proceedings of the Eighth International Symposium of Applications of Ferroelectrics*, IEEE publication No. 92CH3080-9, 408; R. Dat et al., (1994), *Appl.Phys.Lett.* 64, 2673; O. Eom et al., (1993), *Appl.Phys.Lett.* 63, 2570; and O. Auciello et al., (1994), *Appl.Phys.Lett.* 64, 2873.

However, in both cases the PZT capacitors may have drawbacks which can hamper their use in nonvolatile memories. For example, while Pt/PZT/Pt capacitors have relatively low leakage current and relatively good dielectric breakdown properties, they may undergo severe polarization fatigue upon repeated switching. On the other hand, oxide/PZT/oxide heterostructures may have excellent resistance to polarization fatigue, but they usually have relatively high leakage currents as compared to Pt/PZT/Pt capacitors and may be more susceptible to dielectric breakdown.

Researchers have attempted to improve the fatigue characteristics of Pt/PZT/Pt capacitors using various approaches. These attempts included donor doping of the $Pb(Zr_xTi_{1-x})O_3$ films as discussed in H. Watanabe et al., (1992), *Proceedings of the Fourth International Symposium on Integrated Ferroelectrics* pp 346, and J. Chen et al., (1992), *Proceedings of the Eighth International Symposium on Applications of Ferroelectrics*, IEEE No. 92CH3080-9, 111. These attempts also included changing the Zr/Ti ratio as discussed in H. Al-Shareef et al., (1994), *Thin Solid Films*, 252, 38 (1994), and G. Teowee et al., (1993), *MRS Symp.Proc.* 310, pp 423. Still other attempts included the growth of epitaxial PZT thin films as discussed in K. Bellur et al., (1992), *Proceedings of the Eighth International Symposium on Applications of Ferroelectrics*, IEEE publication No. 92CH3080-9, pp 448. Unfortunately, only marginal improvement in the polarization fatigue of Pt/PZT/Pt capacitors could be achieved.

There have also been attempts to reduce the leakage current of PZT films grown on oxide electrodes. In the case of $RuO_2$, these attempts included annealing the bottom $RuO_2$ electrode prior to PZT film deposition. H. Al-Shareef et al., *Thin Solid Films*, 256, 73 (1995). These methods have resulted in some improvement of the leakage characteristics of oxide/PZT/oxide capacitors.

SUMMARY OF THE INVENTION

An alternative approach is the use of hybrid ($Pt,RuO_2$) electrodes. Use of these hybrid electrodes results in PZT thin film capacitors which combine the excellent fatigue characteristics of $RuO_2$/PZT/$RuO_2$ capacitors with the relatively low leakage current characteristics of Pt/PZT/Pt capacitors. The presence of $RuO_2$ in the hybrid electrode improves the resistance of PZT capacitors to polarization fatigue. On the other hand, the presence of Pt in the hybrid electrodes lowers the leakage currents of PZT capacitors grown on hybrid ($Pt,RuO_2$) electrodes. Herein, several types of hybrid electrodes are used to control the electrical properties of PZT thin film capacitors.

In one embodiment of the present invention, a ferroelectric capacitor comprises a first layer of a conducting metal oxide, and a second layer of a metal on the first layer. This capacitor also comprises a third layer of a ferroelectric material on the second layer, and a fourth layer of a conductive material on the third layer.

The conductive metal oxide is preferably ruthenium oxide, iridium oxide, lanthanum strontium cobalt oxide ("LSCO"), indium tin oxide, or yttrium barium copper oxide ("YBCO"), and the second layer is preferably in the range of 50 to 300 Angstroms thick. The metal is preferably a noble metal and most preferable platinum. The conductive material preferably comprises a conductive oxide. The ferroelectric material may include lead zirconate titanate, and the capacitor may be included in an integrated circuit. The capacitor may also comprise a substrate on the first layer opposite the second layer, and this substrate may comprise one of a silicon layer, a silicon dioxide layer, a magnesium oxide layer, a sapphire layer, a silicon carbide layer, a gallium arsenide layer, or a silicon dioxide layer on a silicon layer.

In a second embodiment of the present invention, the ferroelectric capacitor comprises a first layer of a metal, and a second layer on the first layer. This second layer is a conductive metal oxide and is in the range of 150 to 200 Angstroms thick. In this embodiment, the capacitor also comprises a third layer of a ferroelectric material on the second layer, and a fourth layer of a conductive material on the third layer.

The conductive metal oxide is preferably ruthenium oxide, iridium oxide, LSCO, indium tin oxide, or YBCO, and the metal is preferably a noble metal and most preferably platinum. The conductive material preferably comprises a conductive oxide. The ferroelectric material may include lead zirconate titanate, and the capacitor may be included in an integrated circuit. In addition, the capacitor may comprise a substrate on the first layer opposite the second layer, and the substrate may comprise one of a silicon layer, a silicon dioxide layer, a magnesium oxide layer, a sapphire layer, a silicon carbide layer, a gallium arsenide layer, or a silicon dioxide layer on a silicon layer.

In a third embodiment of the present invention, a ferroelectric capacitor comprises a first layer including a mixture of a conductive metal oxide and a noble metal. This capacitor also comprises a second layer of a ferroelectric material on the first layer, and a third layer of a conductive material on the second layer.

The conductive metal oxide is preferably ruthenium oxide, iridium oxide, LSCO, indium tin oxide, or YBCO.

The noble metal is preferably platinum, and the second layer most preferably includes less than about 50 atomic percent platinum. The conductive material preferably comprises a conductive oxide. The ferroelectric material may include lead zirconate titanate, and the capacitor may be part of an integrated circuit. The capacitor may also comprise a substrate on the first layer opposite the second layer, and the substrate may comprise one of a silicon layer, a silicon dioxide layer, a magnesium oxide layer, a sapphire layer, a silicon carbide layer, a gallium arsenide layer, or a silicon dioxide layer on a silicon layer.

In a fourth embodiment of the present invention, a ferroelectric capacitor comprises a first layer including a plurality of alternating interlayers. At least one of the alternating interlayers includes a first metal, and another of the interlayers includes a second metal or a conducting oxide. The capacitor also comprises a second layer of a ferroelectric material on the first layer, and a third layer of a conductive material on the second layer.

The first metal is preferably a noble metal, and is most preferably platinum. At least one of the alternating interlayers may include a noble metal, and another of the interlayers may include ruthenium, iridium, ruthenium oxide, iridium oxide, lanthanum strontium cobalt oxide, indium tin oxide, or YBCO. The conductive material preferably comprises a conductive oxide. The ferroelectric material may include lead zirconate titanate, and the capacitor may be included in an integrated circuit. The capacitor may also comprise a substrate on the first layer opposite the second layer, and the substrate may comprise a silicon layer, a silicon dioxide layer, a magnesium oxide layer, a sapphire layer, a silicon carbide layer, a gallium arsenide layer, or a silicon dioxide layer on a silicon layer. In addition, the capacitor may include a primary layer of a primary metal on the first layer opposite the second layer, and this primary metal may comprise a noble metal such as platinum.

In a fifth embodiment of the present invention, a ferroelectric capacitor comprises a first layer of a metal, and a second layer of a conductive metal oxide on the first layer. This capacitor also comprises a third layer of a ferroelectric material on the second layer, and a fourth layer of the conductive metal oxide on and in direct contact with the third layer.

The conductive metal oxide is preferably ruthenium oxide, iridium oxide, LSCO, indium tin oxide, or YBCO, and the metal is preferably a noble metal, most preferably platinum. The ferroelectric material may include lead zirconate titanate, and the capacitor may be part of an integrated circuit. The capacitor may also comprise a substrate on the first layer opposite the second layer, and the substrate may comprise one of a silicon layer, a silicon dioxide layer, a magnesium oxide layer, a sapphire layer, a silicon carbide layer, a gallium arsenide layer, and a silicon dioxide layer on a silicon layer.

DETAILED DESCRIPTION OF THE INVENTION

The present invention will now be described more fully hereinafter with reference to the accompanying drawings, in which a preferred embodiment of the invention is shown.

This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1A:
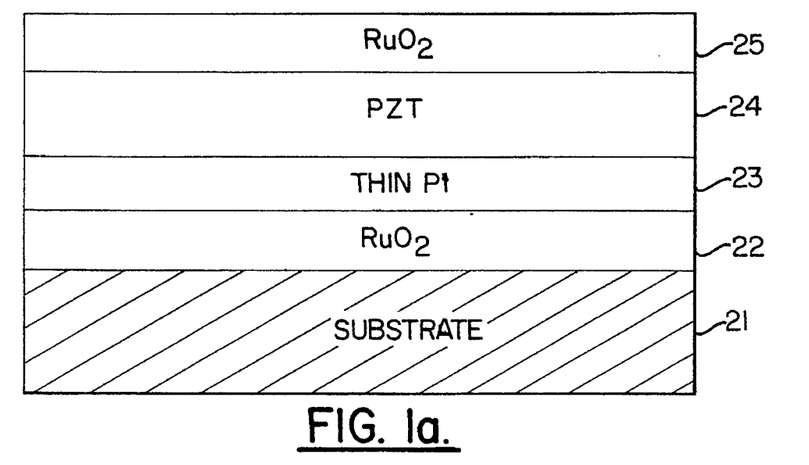
FIG. 1(a) illustrates a cross-sectional view of a PZT capacitor with a thin Pt/$RuO_2$ hybrid bottom electrode.

Referring now to FIG. 1(a), there is shown a first embodiment of a ferroelectric capacitor with a $RuO_2/PZT/Pt/RuO_2$ capacitor structure according to the present invention. The capacitor is formed on a substrate 21 which may comprise either a magnesium oxide layer, or a silicon substrate layer with a silicon dioxide layer adjacent the capacitor structure. The substrate may alternately comprise a silicon layer, a gallium arsenide layer, a silicon carbide layer, a sapphire layer, or layers of other materials known to those having skill in the art. The bottom electrode of the capacitor has a first conducting oxide (preferably $RuO_2$) layer 22 on the substrate, and a second metal (preferably a noble metal) layer 23 on the conducting oxide. A layer 24 of a ferroelectric material (preferably PZT) is provided on the metal layer 23, and a conducting layer (preferably a conducting oxide) 25 is provided on the ferroelectric material to form a top electrode.

The metal layer 23 is preferably a thin Pt layer on the order of 50 Å to 300 Å thick. A thin Pt layer does not significantly degrade the ferroelectric properties of the capacitor, while thicker Pt layers may result in polarization fatigue. In addition, the thin Pt layer improves the leakage current behavior of the capacitor increasing its utility in non-volatile memory applications. It is believed that the thin Pt layer controls nucleation of the perovskite phase PZT and minimizes the formation of a deleterious pyrochlore phase. The thin Pt layer also reduces property variability of the PZT film from device to device on the same substrate as well as from substrate to substrate and batch to batch.

Figure 1B:
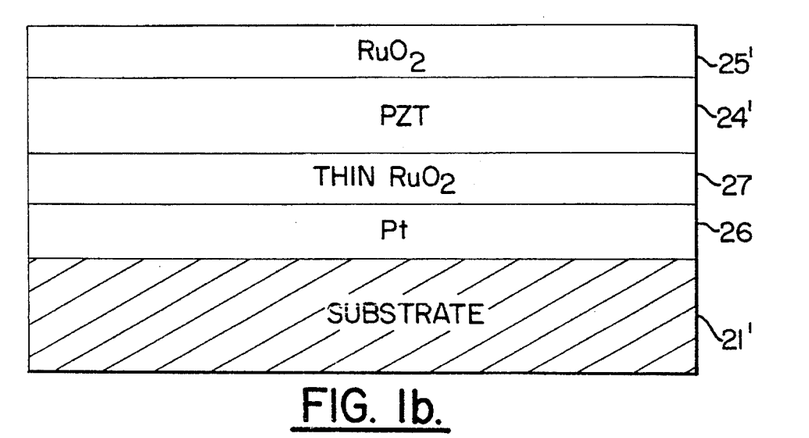
FIG. 1(b) illustrates a cross-sectional view of a PZT capacitor with a thin $RuO_2$/Pt hybrid bottom electrode.

Referring now to FIG. 1(b), there is shown a second embodiment of a ferroelectric capacitor with an $RuO_2/PZT/RuO_2/Pt$ structure according to the present invention. The capacitor is formed on a substrate 21' which may comprise either a magnesium oxide layer, or a silicon substrate layer with a silicon dioxide layer adjacent the capacitor structure. The substrate may alternately comprise a silicon layer, a gallium arsenide layer, a silicon carbide layer, a sapphire layer, or layers of other materials known to those having skill in the art. The bottom electrode of the capacitor has a first metal (preferably a noble metal) layer 26 on the substrate, and a conducting oxide (preferably $RuO_2$) layer 27 on the metal layer. A layer 24' of a ferroelectric material (preferably PZT) is provided on the conducting oxide layer 27, and a conducting layer (preferably a conducting oxide) 25' is provided on the ferroelectric material to form a top electrode. The conducting oxide layer 27 preferably comprises an $RuO_2$ layer having a thickness on the order of 150–200 Å. This $RuO_2$ layer improves polarization leakage without compromising current leakage.

Figure 1C:
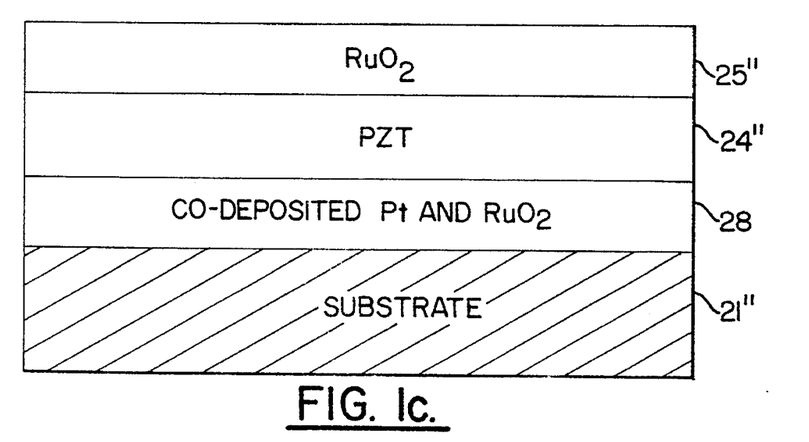
FIG. 1(c) illustrates a cross-sectional view of a PZT capacitor with a co-deposited Pt-$RuO_2$ hybrid bottom electrode.

Referring now to FIG. 1(c), there is shown a third embodiment of a ferroelectric capacitor with an $RuO_2/PZT/(Pt-RuO_2)$ structure according to the present invention. The capacitor is formed on a substrate 21" which may comprise either a magnesium oxide layer, or a silicon substrate layer with a silicon dioxide layer adjacent the capacitor structure. The substrate may alternately comprise a silicon layer, a gallium arsenide layer, a silicon carbide layer, a sapphire layer, or layers of other materials known to those having skill in the art. The bottom electrode of the capacitor is a layer 28 of a co-deposited noble metal (preferably Pt) and a conducting oxide (preferably $RuO_2$). A layer 24" of a ferroelectric material (preferably PZT) is provided on the cod-deposited layer 28, and a conducting layer (preferably a conducting oxide) 25" is provided on the ferroelectric material to form a top electrode.

In each of the embodiments illustrated in FIGS. 1(a–c), the noble metal may comprise one of platinum, palladium, or gold, with platinum being preferred. The conducting oxide may comprise one of iridium oxide, ruthenium oxide, lanthanum strontium cobalt oxide ("LSCO"), indium tin oxide, or yttrium barium copper oxide ("YBCO"), with ruthenium oxide being preferred. The ferroelectric material is preferably a mixture or solution of lead, zirconium, and titanium which forms a perovskite structure and is known as PZT. PZT variants may also be used and these variants may include a dopant or substitution such as lanthanum, tin, or niobium as will be understood by one having skill in the art. In addition, other ferroelectric materials which show fatigue on metal electrodes may be used.

Each of these layers of metals, metal oxides, and ferroelectric materials may be deposited by methods such as ion cluster beam deposition, sputtering, evaporation, molecular beam epitaxy, ion plating, magnetron sputter deposition, ion beam sputter deposition, sol-gel deposition, laser ablation deposition, or other methods known to those having skill in the art. Various deposition techniques are discussed, for example, in U.S. Pat. No. 5,142,437 entitled "Conducting Electrode Layers For Ferroelectric Capacitors In Integrated Circuits And Method" to Kammerdiner et al., and U.S. Pat. No. 5,270,298 entitled "Cubic Metal Oxide Thin Film Epitaxially Grown On Silicon" to Ramesh. Both of the above mentioned patents are hereby incorporated in their entirety herein by reference.

Furthermore, the top electrode in each of FIGS. 1(a–c) respectively comprises a conductive layer 25, 25', and 25". This conductive layer is preferably a layer of a conductive oxide such a ruthenium oxide ($RuO_2$), LSCO, iridium oxide, indium tin oxide, or YBCO ($YBa_2Cu_3O_{7-x}$), but may also include a noble metal such as Pt. Accordingly, the top electrode may comprise a hybrid electrode structure such as those discussed above with regard to the bottom electrodes. For example, the top electrode may comprise a $Pt/RuO_2$ structure, an $RuO_2/Pt$ structure, or a co-deposited $Pt-RuO_2$ structure. In addition, the top electrode may comprise alternating layers as discussed with regard to the bottom electrode of FIG. 6.

Figure 2:
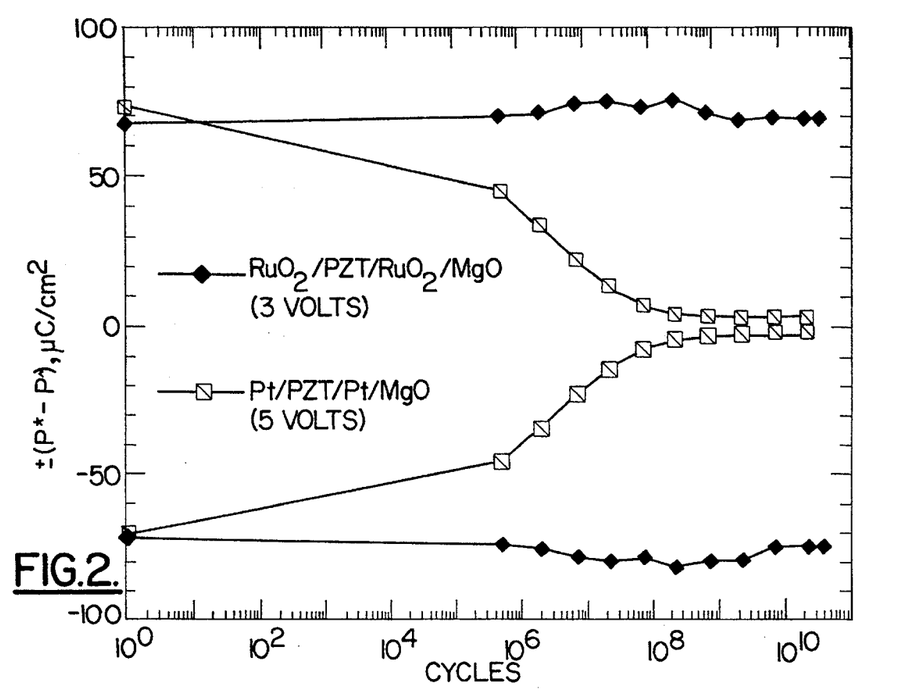
FIG. 2 shows fatigue curves of Pt/PZT/Pt/MgO (indicated by squares with a diagonal slash) and $RuO_2$/PZT/$RuO_2$/ MgO (indicated by filled diamonds) capacitors. The fatigue tests were performed at 500 kHz. The vertical axis denotes values of (P*–P^) in units of $\mu C/cm^2$, and the horizontal axis denotes cycles. The Pt/PZT/Pt/MgO data was obtained with a 5 volt signal, and the $RuO_2$/PZT/$RuO_2$/MgO data was obtained with a 3 volt signal.

Referring now to FIG. 2, there are shown fatigue curves for typical Pt/PZT/Pt/MgO and $RuO_2/PZT/RuO_2/MgO$ capacitor structures. The fatigue tests were performed at 500 kHz. The capacitor with $RuO_2$ electrodes has (P*–P^) values that are essentially constant up to $4 \times 10^{10}$ switching cycles. In comparison, the capacitor with Pt electrodes has (P*–P^) values that have decayed significantly by $3 \times 10^{10}$ switching cycles.

Figure 3:
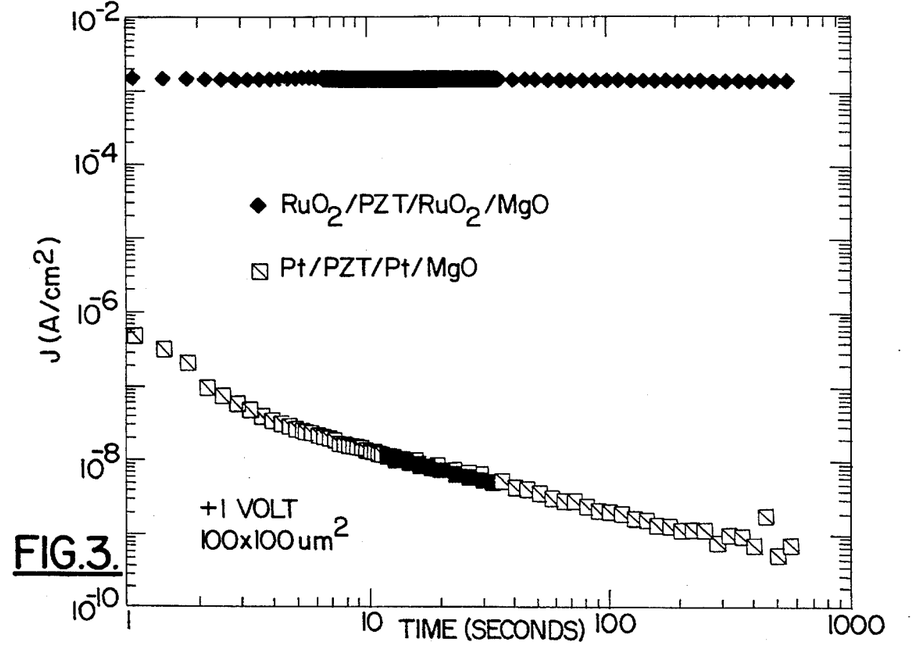
FIG. 3 shows the time dependence of the DC electrical current of Pt/PZT/Pt/MgO (indicated by squares with a diagonal slash) and $RuO_2$/PZT/$RuO_2$/MgO (indicated by filled diamonds) capacitors. The vertical axis denotes values of current in units of $A/cm^2$, and the horizontal axis denotes time in units of seconds. The data was obtained with a 1 volt signal and a 100×100 $\mu m^2$ contact.

Referring now to FIG. 3, there is shown the time dependence of the DC electrical current for typical Pt/PZT/Pt/MgO and $RuO_2/PZT/RuO_2/MgO$ capacitor structures. While the capacitor with $RuO_2$ electrodes has superior fatigue characteristics, the capacitor with the Pt electrodes has a much lower leakage current. As shown, the capacitor with $RuO_2$ electrodes has a leakage current that is several orders of magnitude higher than the capacitor with Pt electrodes.

Figure 4:
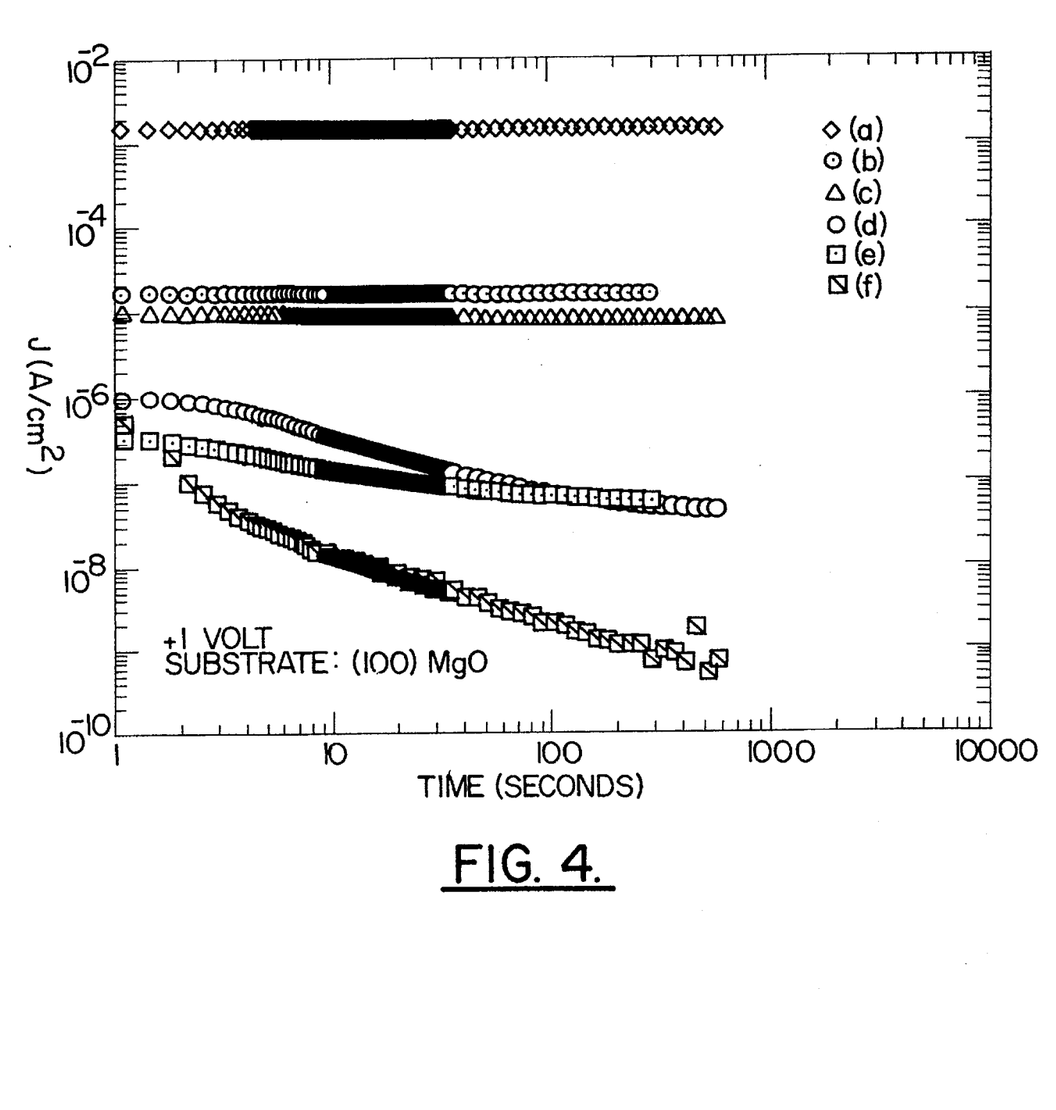
FIG. 4 shows I-t curves for: (a) an $RuO_2$/PZT/$RuO_2$ capacitor (indicated by filled diamonds); (b) an $RuO_2$/PZT/ (Pt-$RuO_2$) capacitor (indicated by circles with a dot); (c) an $RuO_2$/PZT/100 ÅPt/$RuO_2$ (Pt grown at RT) capacitor (indicated by unfilled triangles); (d) an $RuO_2$/PZT/200 Å$RuO_2$/ Pt/$RuO_2$ capacitor (indicated by unfilled circles); (e) an $RuO_2$/PZT/100 ÅPt/$RuO_2$ (Pt grown at 400° C.) capacitor (indicated by squares with a dot); and (f) a Pt/PZT/Pt capacitor (indicated by squares with a diagonal slash). The vertical axis denotes values of current in units of $A/cm^2$, and the horizontal axis denotes time in units of seconds. The data was obtained with a 1 volt signal, and each sample was provided on a MgO substrate with a (100) orientation.

Referring now to FIG. 4, there are shown I-t curves for: (a) an $RuO_2/PZT/RuO_2$ capacitor; (b) an $RuO_2/PZT/(Pt-RuO_2)$ capacitor; (c) an $RuO_2/PZT/100$ ÅPt/$RuO_2$ capacitor (Pt grown at RT) capacitor; (d) an $RuO_2/PZT/200$ Å$RuO_2/$ Pt/RuO$_2$ capacitor; (e) an RuO$_2$/PZT/100 ÅPt/RuO$_2$(Pt grown at 400° C.) capacitor; and (f) a Pt/PZT/Pt capacitor. A typical RuO$_2$/PZT/RuO$_2$ is indicated as sample (a) and has a leakage current that is roughly two orders of magnitude higher than any of the capacitors with hybrid electrodes which are indicated as samples (b), (c), (d), and (e).

Figure 5:
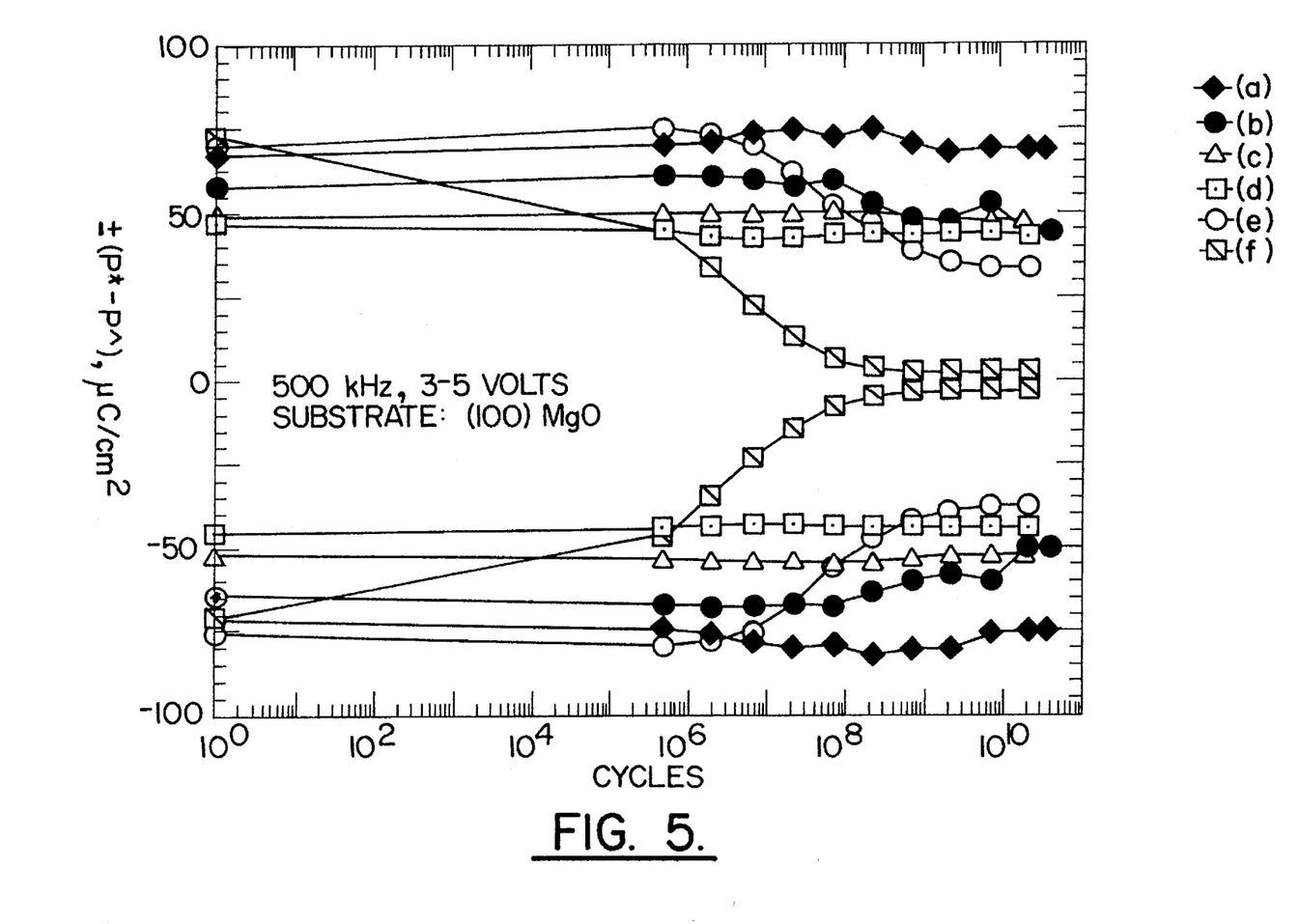
FIG. 5 shows fatigue curves for: (a) an $RuO_2$/PZT/$RuO_2$ capacitor (indicated by filled diamonds); (b) an $RuO_2$/PZT/ (Pt-$RuO_2$)/$RuO_2$ capacitor (indicated by filled circles); (c) an $RuO_2$/PZT/100 ÅPt/$RuO_2$ (Pt grown at RT) capacitor (indicated by unfilled triangles); (d) an $RuO_2$/PZT/100 ÅPt/ $RuO_2$ (Pt grown at 400° C.) capacitor (indicated by squares with a dot); (e) an $RuO_2$/PZT/200 Å$RuO_2$/Pt/$RuO_2$ capacitor (indicated by unfilled circles); and (f) a Pt/PZT/Pt capacitor (indicated by squares with a diagonal slash). The vertical axis denotes values of (P*–P^) in units of $\mu C/cm^2$, and the horizontal axis denotes cycles. The data was obtained with a 3–5 volt 500 kHz signal, and each sample was provided on a MgO substrate with a (100) orientation.

Referring now to FIG. 5, there are shown fatigue curves for: (a) an RuO$_2$/PZT/RuO$_2$ capacitor; (b) an RuO$_2$/PZT/(Pt-RuO$_2$)/RuO$_2$ capacitor; (c) an RuO$_2$/PZT/100 ÅPt/RuO$_2$ (Pt grown at RT) capacitor; (d) an RuO$_2$/PZT/100 ÅPt/RuO$_2$ (Pt grown at 400° C.) capacitor; (e) an RuO$_2$/PZT/200 ÅRuO$_2$/Pt/RuO$_2$ capacitor; and (f) a Pt/PZT/Pt capacitor. The typical Pt/PZT/Pt capacitor, represented as sample (f), has a magnitude of (P*−P^) that drops to approximately 5 µC/cm$^2$ after approximately 3×10$^{10}$ cycles. In comparison, each of the capacitors with hybrid electrodes, represented as samples (b), (c), (d), and (e), maintains a (P*−P^) magnitude of approximately 35 µC/cm$^2$ or greater after 3×10$^{10}$ cycles.

Figure 6:
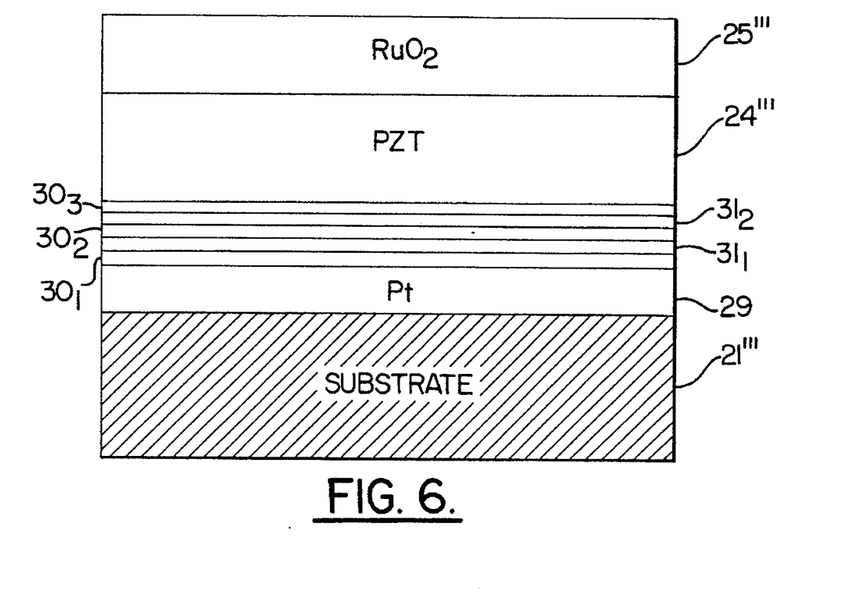
FIG. 6 illustrates a cross-sectional view of a PZT capacitor with alternating bottom layers of Pt and $RuO_2$ or alternating bottom layers of Pt and Ru.

Referring now to FIG. 6, there is shown a fourth embodiment of a ferroelectric capacitor wherein the bottom electrode comprises a plurality of alternating layers. These alternating layers are preferably alternating layers of Pt and RuO$_2$, or alternating layers of Pt and Ru. The capacitor is formed on a substrate 21''' which may be either a magnesium oxide layer, or a silicon substrate layer with a silicon dioxide layer adjacent the capacitor structure. The substrate may alternately comprise a silicon layer, a gallium arsenide layer, a silicon carbide layer, a sapphire layer, or layers of other materials known to those having skill in the art. The bottom electrode of the capacitor comprises a structure of alternating layers 30$_1$, 31$_1$, 30$_2$, 31$_2$, and 30$_3$. Layers 30$_1$, 30$_2$, and 30$_3$ may comprise iridium, ruthenium, iridium oxide, ruthenium oxide, LSCO, indium tin oxide, or YBCO. Layers 31$_1$ and 31$_2$ may comprise a noble metal such as platinum, gold, or palladium. The bottom electrode may also comprise an optional primary layer 29 of a noble metal (preferably Pt). A layer 24''' of a ferroelectric material (preferably PZT) is provided on the second layer 30, and a conducting layer (preferably a conducting oxide) 25''' is provided on the ferroelectric material to form a top electrode.

In a preferred embodiment, layers 30$_{(1-3)}$ comprise a conductive oxide (preferably RuO$_2$) or a metal (preferably Ru), and layers 31$_{(1-2)}$ comprise a noble metal (preferably Pt). While five alternating layers are shown, it will be understood that this bottom electrode structure may include any number of alternating layers. Preferably, each layer 30$_{(1-m)}$ and 31$_{(1-n)}$ is in the range of 10 Å–300 Å thick, and the total thickness for this structure of alternating layers 30$_{(1-m)}$ and 31$_{(1-n)}$ is in the range of 800 Å–3000 Å thick. In addition, the first layer may be either a layer 30$_1$ or 31$_1$, and the last layer may be either a layer 30$_m$ or 31$_n$.

The noble metal may comprise one of platinum, palladium, or gold, with platinum being preferred. The ferroelectric material is preferably a mixture or solution of lead, zirconium, and titanium which forms a perovskite structure and is known as PZT. PZT variants may also be produced and these variants may include a dopant or substitution such as lanthanum, tin, or niobium as will be understood by one having skill in the art. In addition, other ferroelectric materials which show fatigue on metal electrodes may be used.

Each of these layers of metals, conductive oxides, and ferroelectric materials may be deposited by methods such as ion cluster beam deposition, sputtering, evaporation, molecular beam epitaxy, ion plating, magnetron sputter deposition, ion beam sputter deposition, sol-gel deposition, laser ablation, or other methods known to those having skill in the art. Various deposition techniques are discussed in U.S. Pat. No. 5,142,437 entitled "Conducting Electrode Layers For Ferroelectric Capacitors In Integrated Circuits And Method" to Kammerdiner et al., and U.S. Pat. No. 5,270,298 entitled "Cubic Metal Oxide Thin Film Epitaxially Grown On Silicon" to Ramesh. Both of the above mentioned patents are hereby incorporated in their entirety herein by reference.

Furthermore, the top electrode in FIGS. 6 comprises a conductive layer 25'''. This conductive layer is preferably a layer of a conductive oxide such as ruthenium oxide (RuO$_2$), iridium oxide, LSCO, indium tin oxide, or YBCO, and this electrode may also include a noble metal such as Pt. Accordingly, the top electrode may comprise a hybrid electrode structure such as those discussed above with regard to the bottom electrodes. For example, the top electrode may comprise a Pt/RuO$_2$ structure, an RuO$_2$/Pt structure, or a co-deposited Pt-RuO$_2$ structure. In addition, the top electrode may comprise alternating layers of Ru or RuO$_2$ and Pt.

Each of the capacitors with hybrid electrodes, illustrated in FIGS. 1(a–c) and 6, is preferably included as an element in an integrated circuit chip such as a non-volatile memory or a dynamic random access memory. Accordingly, a plurality of ferroelectric capacitors with hybrid electrodes can be manufactured simultaneously on a single integrated circuit chip.

Figure 7A:
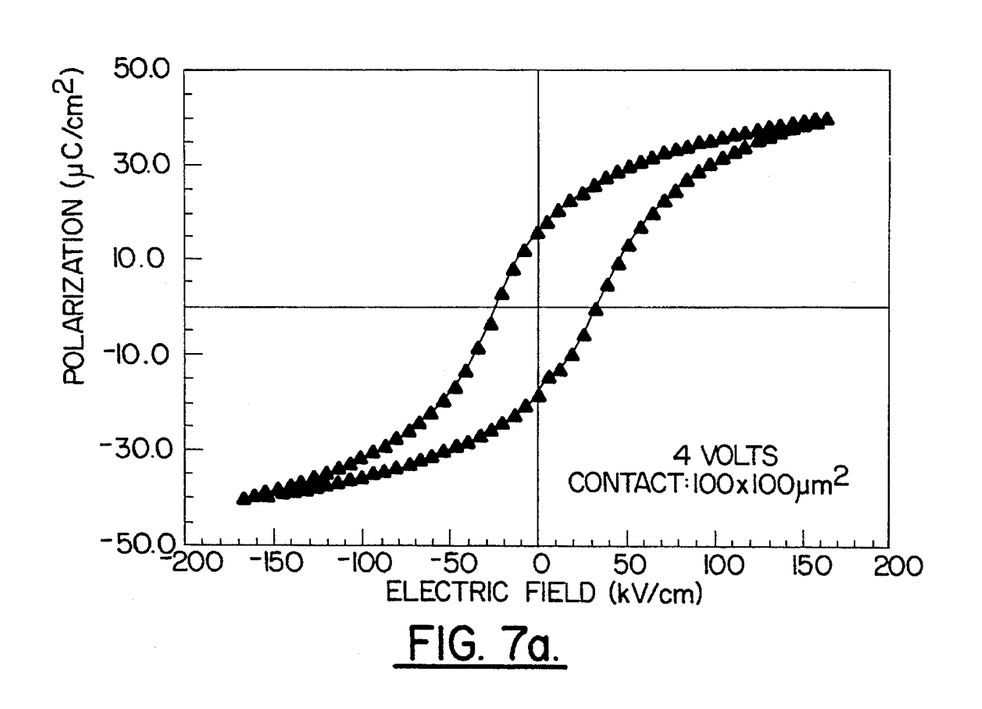
FIG. 7(a) shows a hysteresis loop for a $RuO_2$/PZT/100 ÅPt/$RuO_2$/$SiO_2$/Si capacitor. The vertical axis denotes values of polarization in units of $\mu C/cm^2$, and the horizontal axis denotes values of the electric field in units of kV/cm. The data was obtained with a 4 volt signal and a 100×100 $\mu m^2$ contact.
Figure 7B:
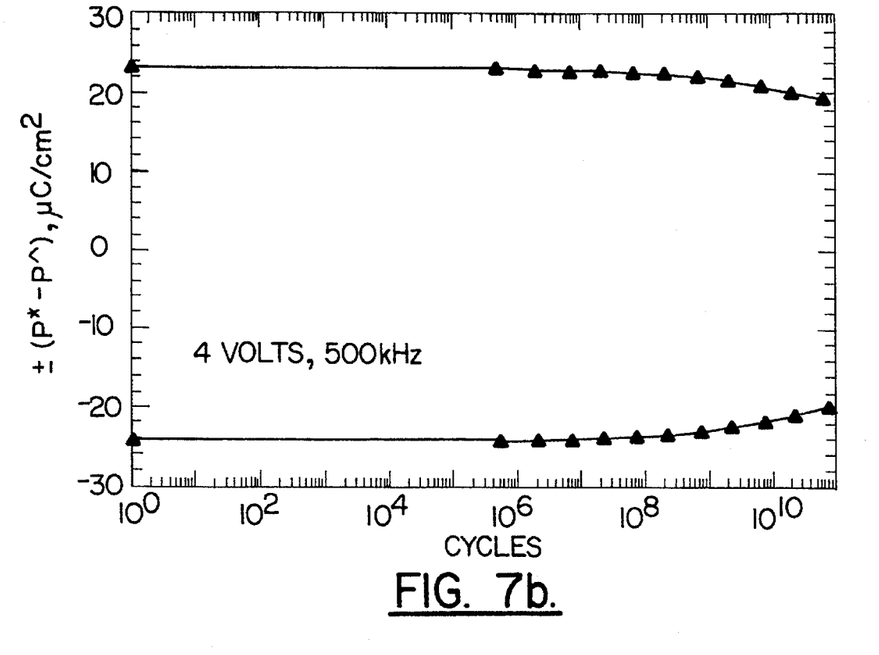
FIG. 7(b) shows a fatigue curve for a $RuO_2$/PZT/100 ÅPt/$RuO_2$/$SiO_2$/Si capacitor. The vertical axis denotes values of (P*–P^) in units of $\mu C/cm^2$, and the horizontal axis denotes cycles. The data was obtained with a 4 volt 500 kHz signal.
Figure 7C:
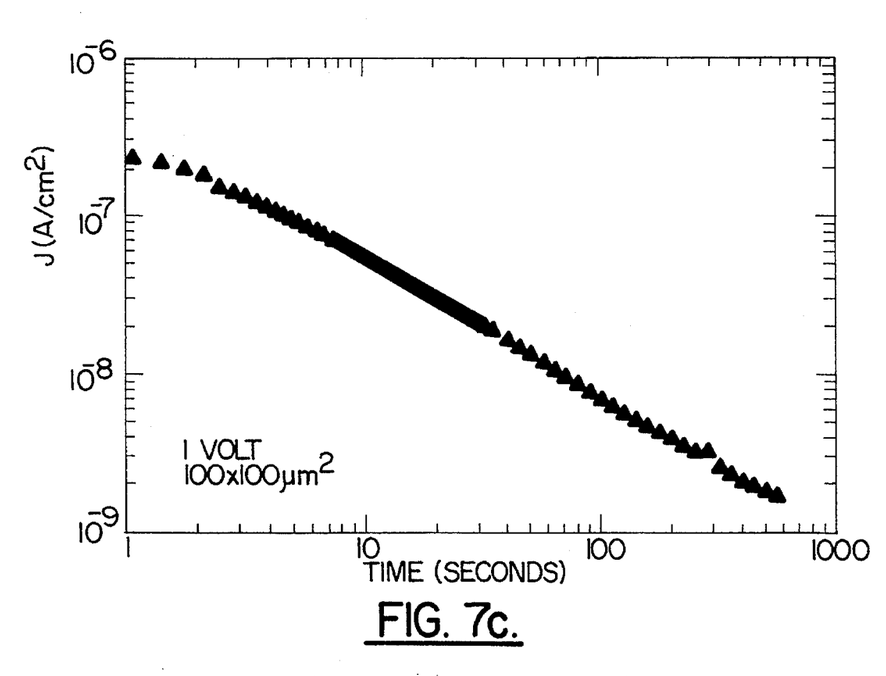
FIG. 7(c) shows a time dependence of the DC electrical current of a $RuO_2$/PZT/100 ÅPt/$RuO_2$/$SiO_2$/Si capacitor. The vertical axis denotes values of current in units of $A/cm^2$, and the horizontal axis denotes time in units of seconds. The data was obtained with an input voltage of 1 volt and a contact area of 100×100 $\mu m^2$

Referring now to FIGS. 7(a–c), there are respectively shown a hysteresis loop, a fatigue curve, and DC electrical current time dependence curve for an RuO$_2$/pZT/100 ÅPt/RuO$_2$/SiO$_2$/Si capacitor structure. This capacitor structure maintains a (P*−P^) magnitude of approximately 20 µC/Cm$^2$ at 3×10$^{10}$ cycles. This capacitor structure also has a leakage current of approximately 2×10$^{-7}$ A/cm$^2$ at one second and approximately 2×10$^{-9}$ A/cm$^2$ at 6×10$^2$ seconds.

EXAMPLES

Five capacitor types are prepared for this study. Three of the capacitor types had hybrid (Pt, RuO$_2$) bottom electrodes with the following structures: RuO$_2$/pZT/pt/RuO$_2$/MgO; RuO$_2$/pZT/RuO$_2$/pt/MgO; and RuO$_2$/pZT/(pt-RuO$_2$)/MgO. Schematic illustrations of each of these capacitor structures are shown respectively in FIGS. 1(a), 1(b), and 1(c). The other two capacitor types, which are included for comparison, had similar top and bottom electrodes with the following structures: Pt/PZT/Pt/MgO and RuO$_2$/PZT/RuO$_2$/MgO. Details of the Pt and RuO$_2$ deposition conditions are discussed in H. Al-Shareef et al., (1993), *Integrated Ferroelectrics* 3,321.

In the case of the RuO$_2$/PZT/Pt/RuO$_2$/MgO capacitor, shown in FIG. 1(a), a Pt interlayer 22 (on the order of 100 Å thick) was deposited on the bottom RuO$_2$ electrode 21, prior to PZT film 24 growth, both by ion beam sputter-deposition (at 400° C.) and by magnetron sputter-deposition (at room temperature). In the case of the RuO$_2$/PZT/RuO$_2$/Pt/MgO capacitor, shown in FIG. 1(b), an RuO$_2$ interlayer 27 (on the order of 200 Å thick) was deposited by ion beam sputter-deposition at 400° C. on the Pt bottom electrode 26 prior to PZT film 24' growth. For the RuO$_2$/PZT/(Pt-RuO$_2$)/MgO capacitor, shown in FIG. 1(c), the bottom electrode was a co-deposited Pt-RuO$_2$ layer 28. The Pt-RuO$_2$ layer 28 was grown using ion beam sputter-deposition at 400–500° C. The sputtering target included both Pt and Ru metals.

PZT thin films 24, 24', and 24" (0.2–0.25 µm thick) were subsequently deposited on the Pt, RuO$_2$, and the hybrid bottom electrodes using a spin-on sol-gel process described in R. Schwartz et al., *Matt.Res.Soc.Symp.* 243, pp 245. The solution used to make the PZT films for this study had a Zr/Ti ratio of 53/47 and a 5 mol% excess Pb to compensate for lead loss during annealing. Each film was formed by multilayer deposition, with each layer initially heat treated at 300° C. for 5 minutes in air. The films were finally crystallized by annealing at 700° C. for 10 minutes in air. The PZT thin film may also be created by other methods such as ion cluster beam deposition, sputtering, evaporation, molecular beam epitaxy, ion plating, magnetron sputter deposition, ion beam sputter deposition, sol-gel deposition, laser ablation, or other methods known to those having skill in the art.

For all capacitors, except the Pt/PZT/Pt/MgO capacitor, $RuO_2$ top electrodes 25, 25', and 25" were deposited on the PZT films using ion beam sputter-deposition. The top electrodes were patterned using standard photolithographic techniques and the ion beam etching (500 eV, 8 mA $Ar^+$ion beam). After patterning of the top electrodes, the entire capacitor stack was annealed at 550° C. for 10 minutes in air. Alternately, hybrid electrodes, such as $Pt/RuO_2$ electrodes, $RuO_2$/Pt electrodes, co-deposited $Pt-RuO_2$ electrodes, or electrodes with alternating layers of Pt and $RuO_2$, may be used as the top electrodes 25, 25', and 25".

Before the properties of PZT capacitors with hybrid ($Pt,RuO_2$) electrodes are discussed, it is useful to present first the typical electrical characteristics of Pt/PZT/Pt and $RuO_2$/PZT/$RuO_2$ capacitors. The fatigue and DC leakage characteristics of typical Pt/PZT/Pt/MgO and $RuO_2$/PZT/$RuO_2$/MgO capacitors are shown in FIGS. 2 and 3, respectively. Notice that the difference between the switched and non-switched polarizations (P*–P^) decays by nearly 95% after $3 \times 10^{10}$ cycles in the case of the capacitor with Pt electrodes (the Pt/PZT/Pt/MgO capacitors have in some cases shown only 50% drop in (P*–P^), but most samples typically show more than 90% drop). In comparison the (P*–P^) value of the $RuO_2$/PZT/$RuO_2$/MgO capacitor remains essentially constant up to $4 \times 10^{10}$ switching cycles. While the capacitor with $RuO_2$ electrodes has superior fatigue, it has much higher leakage current than the Pt/PZT/Pt/MgO capacitor as shown in FIG. 3. Notice that the $RuO_2$/PZT/$RuO_2$/MgO capacitor has a leakage current that is several orders of magnitude higher than the Pt/PZT/Pt/MgO capacitor.

The hybrid ($Pt,RuO_2$) electrode concept was developed based on the observation that nucleation of single phase perovskite PZT films is easier to achieve on Pt than on $RuO_2$ electrodes as discussed in Al-Shareef, H. N., Bellur, K. R. Auciello, O., and Kingon, A. I., *Ferroelectrics*, Vol. 152, p. 85, (1994). PZT films grown on Pt were characterized by a high nucleation site density and were phase-pure perovskite. In comparison, the films grown on $RuO_2$ were characterized by a low nucleation site density and contained a non-ferroelectric conductive second phase as discussed in Al-Shareef, H. N., Bellur, K. R. Auciello, O., and Kingon, A. I., *Ferroelectrics*, Vol. 152, p. 85, (1994). Thus, by combining Pt and $RuO_2$ into one bottom electrode (hence the term hybrid electrode), one can enhance nucleation and crystallization of perovskite PZT, thereby eliminating the second phase and reducing the leakage current of the capacitors. If the amount of Pt in the hybrid electrode is properly controlled, the excellent resistance to fatigue can also be maintained.

Three hybrid electrode types were evaluated. The first included a thin Pt layer 23 on a bottom $RuO_2$ electrode 22 as shown in FIG. 1(a); the second included a thin $RuO_2$ layer 27 on a bottom Pt electrode 26 as shown in FIG. 1(b); and the third included a co-deposited ($Pt-RuO_2$) layer 28 used as a bottom electrode as shown in FIG. 1(c). The electrical properties (DC leakage, and fatigue) of PZT capacitors grown by the sol-gel process on these three hybrid electrodes are shown in FIGS. 4 and 5. The fatigue and leakage behavior of the Pt/PZT/Pt/MgO and $RuO_2$/PZT/$RuO_2$/MgO are also included in FIGS. 4 and 5 to facilitate comparison. These hybrid electrodes may be used with PZT layers formed by deposition methods such as ion cluster beam deposition, sputtering, evaporation, molecular beam epitaxy, ion plating, magnetron sputter deposition, ion beam sputter deposition, sol-gel deposition, laser ablation, or other methods known to those having skill in the art.

Two PZT capacitors with the $RuO_2$/PZT/100 ÅPt/$RuO_2$/MgO heterostructures shown in FIG. 1(a) were tested. One had a Pt interlayer produced by magnetron sputter-deposition at room temperature, while the other had a Pt interlayer produced by ion beam sputter-deposition at 400° C. Capacitors of this type typically had a remanent polarization of about 35–40 $\mu C/cm^2$ and they were fully switched at 3–4 Volts. In typical hysteresis loops (data not shown), the actual remanent polarization value (+Pr) appears to be smaller than it actually is due to the asymmetry of the loop along the field axis. This asymmetry results because the top and bottom electrodes are different, and the bottom electrode is usually exposed to higher temperatures (during film deposition) than the top one. FIG. 4 sample (c) shows that the $RuO_2$/PZT/100 ÅPt/$RuO_2$/MgO capacitor (with Pt interlayer deposited by magnetron sputtering at room temperature) has two orders of magnitude lower leakage current than does the typical $RuO_2$/PZT/$RuO_2$/MgO capacitor, sample (a). In comparison, FIG. 4 sample (e) also shows that the $RuO_2$/PZT/100 ÅPt/$RuO_2$/MgO capacitor (with Pt interlayer deposited by ion beam sputtering at 400° C.) has four orders of magnitude lower leakage current than does the $RuO_2$/PZT/$RuO_2$/MgO capacitor, sample (a). This reduction in leakage current is achieved without compromising the excellent fatigue behavior usually observed on $RuO_2$/PZT/$RuO_2$ capacitors without a Pt interlayer. As can be seen in FIG. 5 samples (c) and (d), both $RuO_2$/PZT/100 ÅPt/$RuO_2$/MgO capacitors show negligible fatigue up to $3 \times 10^{10}$ cycles.

The above data shows that using a thin Pt interlayer (on the order of 100 Å) between the PZT film and the bottom $RuO_2$ electrode reduces the leakage current of PZT capacitors while maintaining an excellent resistance to polarization fatigue.

The capacitors with the 100 Å Pt interlayer deposited at room temperature by magnetron sputtering usually have higher leakage current and better fatigue than the capacitors with the 100 Å Pt interlayer deposited by ion beam sputter-deposition at 400° C. The Pt films grown by ion beam sputtering (at 400° C.) are more dense than those grown by magnetron sputter-deposition (at room temperature) as discussed in P. Hren et al., (1992), *Integrated Ferroelectrics* 2, 311. Therefore, more $RuO_2$ is expected to be in contact with the PZT film in the case of the capacitors with the 100 Å Pt interlayer grown at room temperature. That is why the properties of the $RuO_2$/PZT/100 ÅPt/$RuO_2$/MgO capacitor (with room temperature deposited Pt interlayer) are closer to those of $RuO_2$/PZT/$RuO_2$/MgO capacitors.

TEM observation has revealed no apparent second phases in PZT films grown on 100 ÅPt/$RuO_2$ hybrid electrodes. The presence of the Pt interlayer appears to have increased the nucleation site density and enhanced crystallization of single phase perovskite PZT.

The second hybrid electrode type included a thin $RuO_2$ layer on a Pt bottom electrode. PZT capacitors with this hybrid electrode type had an $RuO_2/PZT/200$ Å$RuO_2/Pt/MgO$ heterostructure as shown in FIG. 1(b). This capacitor type has a remanent polarization of about 40 $\mu C/cm^2$ and it is well saturated at 40 Volts (data not shown). The leakage current and fatigue behavior of this capacitor type are shown in FIGS. 4 and 5, respectively. FIG. 4 sample (d) shows that this capacitor type has a leakage current of about $5 \times 10^{-8}$ $A/cm^2$ (at 1 Volt). This is nearly five orders of magnitude lower than the leakage current of a typical $RuO_2/PZT/RuO_2/MgO$ capacitor. The fatigue curve of this capacitor type ($RuO_2/PZT/200$ Å$RuO_2/Pt/MgO$) shows about a 50% drop in the magnitude of (P*–P^) after $3 \times 10^{10}$ switching cycles. This is shown in FIG. 5 as sample (e). However, it can be seen that the magnitude of (P*–P^) is beginning to level off to a value of 35 $\mu C/cm_2$.

The third hybrid electrode type included a Pt-$RuO_2$ co-deposited layer. The co-deposited layer is formed by sputtering a target that includes both Pt and Ru metals. The Pt-$RuO_2$ layer was used as a bottom electrode to produce $RuO_2/PZT/Pt$-$RuO_2/MgO$ capacitors as shown in FIG. 1(c).

The electrical properties of such capacitors were dependent on the composition of the Pt-$RuO_2$ co-deposited layer. For a Pt-$RuO_2$ layer with 50 atomic % Pt (determined by RBS), the properties are also shown in FIG. 4 sample (b) and FIG. 5 sample (b).

As seen in FIG. 4 sample (b), this capacitor has a leakage current that is two orders of magnitude lower than the leakage current of a typical $RuO_2/PZT/RuO_2/MgO$ capacitor indicated as sample (a). FIG. 5 sample (b) shows that this capacitor type has good fatigue behavior, where (P*–P^) decays about 20% after $5 \times 10^{10}$ switching cycles. It should be added here that when a PT-$RuO_2$ layer with 80 atomic % Pt was used as a bottom electrode in an $RuO_2/PZT/Rt$-$RuO_2/MgO$ capacitor, the value of (P*–P^) dropped by 70% after $5 \times 10^{10}$ cycles; the leakage current of such a capacitor was less than $10^{-9}$ $A/cm^2$ (at 1 Volt) (data not shown).

The results discussed above show that there is a trade-off between the resistance to polarization fatigue and the resistivity or leakage current level of PZT capacitors. Therefore, one has to manipulate the thicknesses of the Pt and $RuO_2$ interlayers (in the case of the Pt/$RuO_2$ and $RuO_2$/Pt hybrid electrodes) and the Pt-$RuO_2$ composition (in the case of the co-deposited hybrid electrodes) to achieve the optimum leakage current and fatigue of PZT capacitors.

Three types of (Pt,$RuO_2$) hybrid electrodes were evaluated as replacements for the bottom $RuO_2$ electrode in $RuO_2/PZT/RuO_2$ capacitors. Each hybrid electrode type was evaluated in terms of its effect on the leakage current, polarization fatigue, and retention loss of PZT capacitors as compared to $RuO_2/PZT/RuO_2$ capacitors. It was shown that using hybrid electrodes can result in PZT capacitors with leakage currents two to four orders of magnitude lower than those of a typical $RuO_2/PZT/RuO_2$ capacitor. This reduction in leakage current is achieved while at the same time maintaining the excellent resistance to polarization fatigue characteristic of the $RuO_2/PZT/RuO_2$ capacitors. In addition, it was shown that all capacitors with hybrid electrodes have negligible retention loss.

The foregoing examples are illustrative of the present invention, and are not to be construed as limiting thereof. The invention is defined by the following claims, with equivalents of the claims to be included therein.

That which is claimed is:

1. A ferroelectric capacitor comprising:
   a first layer comprising a conducting metal oxide;
   a second layer on said first layer, said second layer comprising a metal, wherein said second layer is deposited sufficiently thin to complement said first layer to improve the leakage current behavior of the capacitor and minimize polarization fatigue;
   a third layer on said second layer opposite said first layer, said third layer comprising a ferroelectric material; and
   a fourth layer on said third layer opposite said second layer, said fourth layer comprising a conductive material.

2. A ferroelectric capacitor according to claim 1 wherein said conductive metal oxide comprises one of ruthenium oxide, iridium oxide, lanthanum strontium cobalt oxide, indium tin oxide, or yttrium barium copper oxide.

3. A ferroelectric capacitor according to claim 1 wherein said second layer is in the range of 50 to 300 Angstroms thick.

4. A ferroelectric capacitor according to claim 1 wherein said metal comprises a noble metal.

5. A ferroelectric capacitor according to claim 4 wherein said noble metal comprises platinum.

6. A ferroelectric capacitor according to claim 1 wherein said conductive material comprises a conductive oxide.

7. A ferroelectric capacitor according to claim 1 wherein said ferroelectric material comprises lead zirconate titanate.

8. A ferroelectric capacitor according to claim 1 wherein said capacitor is included in an integrated circuit.

9. A ferroelectric capacitor according to claim 1 further comprising a substrate on said first layer opposite said second layer.

10. A ferroelectric capacitor according to claim 9 wherein said substrate comprises one of a silicon layer, a silicon dioxide layer, a magnesium oxide layer, a sapphire layer, a silicon carbide layer, a gallium arsenide layer, or a silicon dioxide layer on a silicon layer.

11. A ferroelectric capacitor comprising:
   a first layer comprising a metal;
   a second layer on said first layer, said second layer comprising a conductive metal oxide wherein said second layer is in the range of 150 to 200 Angstroms thick, wherein said second layer improves polarization fatigue of the capacitor without compromising leakage current;
   a third layer on said second layer opposite said first layer, said third layer comprising a ferroelectric material; and
   a fourth layer on said third layer opposite said second layer, said fourth layer comprising a conductive material.

12. A ferroelectric capacitor according to claim 11 wherein said conductive metal oxide comprises one of ruthenium oxide, iridium oxide, lanthanum strontium cobalt oxide, indium tin oxide, or yttrium barium copper oxide.

13. A ferroelectric capacitor according to claim 11 wherein said metal comprises a noble metal.

14. A ferroelectric capacitor according to claim 13 wherein said noble metal comprises platinum.

15. A ferroelectric capacitor according to claim 11 wherein said conductive material comprises a conductive oxide.

16. A ferroelectric capacitor according to claim 11 wherein said ferroelectric material comprises lead zirconate titanate.

17. A ferroelectric capacitor according to claim 11 wherein said capacitor is included in an integrated circuit.

18. A ferroelectric capacitor according to claim 11 further comprising a substrate on said first layer opposite said second layer.

19. A ferroelectric capacitor according to claim 18 wherein said substrate comprises one of a silicon layer, a silicon dioxide layer, a magnesium oxide layer, a sapphire layer, a silicon carbide layer, a gallium arsenide layer, or a silicon dioxide layer on a silicon layer.

20. A ferroelectric capacitor comprising:

a first layer comprising a mixture of a conductive metal oxide and a noble metal;

a second layer on said first layer, said second layer comprising a ferroelectric material; and a third layer on said second layer opposite said first layer, said third layer comprising a conductive material.

21. A ferroelectric capacitor according to claim 20 wherein said conductive metal oxide comprises one of ruthenium oxide, iridium oxide, lanthanum strontium cobalt oxide, indium tin oxide, or yttrium barium copper oxide.

22. A ferroelectric capacitor according to claim 20 wherein said noble metal comprises platinum.

23. A ferroelectric capacitor according to claim 22 wherein said first layer comprises less than about 50 atomic percent platinum.

24. A ferroelectric capacitor according to claim 20 wherein said conductive material comprises a conductive oxide.

25. A ferroelectric capacitor according to claim 20 wherein said ferroelectric material comprises lead zirconate titanate.

26. A ferroelectric capacitor according to claim 20 wherein said capacitor is part of an integrated circuit.

27. A ferroelectric capacitor according to claim 20 further comprising a substrate on said first layer opposite said second layer.

28. A ferroelectric capacitor according to claim 27 wherein said substrate comprises one of a silicon layer, a silicon dioxide layer, a magnesium oxide layer, a sapphire layer, a silicon carbide layer, a gallium arsenide layer, or a silicon dioxide layer on a silicon layer.

29. A ferroelectric capacitor comprising:

a first layer comprising a plurality of repeating alternating interlayers, at least one of said alternating interlayers comprising a first metal, and another of said interlayers comprising one of a second metal and a conducting oxide;

a second layer on said first layer, said second layer comprising a ferroelectric material; and a third layer on said second layer opposite said first layer, said third layer comprising a conductive material.

30. A ferroelectric capacitor according to claim 29 wherein at least one of said alternating interlayers comprises a noble metal, and another of said interlayers comprises one of ruthenium, iridium, ruthenium oxide, iridium oxide, lanthanum strontium cobalt oxide, indium tin oxide, or yttrium barium copper oxide.

31. A ferroelectric capacitor according to claim 29 wherein said conductive material comprises a conductive oxide.

32. A ferroelectric capacitor according to claim 29 wherein said ferroelectric material comprises lead zirconate titanate.

33. A ferroelectric capacitor according to claim 29 wherein said capacitor is included in an integrated circuit.

34. A ferroelectric capacitor according to claim 29 further comprising a substrate on said first layer opposite said second layer.

35. A ferroelectric capacitor according to claim 34 wherein said substrate comprises one of a silicon layer, a silicon dioxide layer, a magnesium oxide layer, a sapphire layer, a silicon carbide layer, a gallium arsenide layer, or a silicon dioxide layer on a silicon layer.

36. A ferroelectric capacitor according to claim 29 further comprising a primary layer on said first layer opposite said second layer, said primary layer comprising a primary metal.

37. A ferroelectric capacitor according to claim 36 wherein said primary metal comprises a noble metal.

38. A ferroelectric capacitor according to claim 37 wherein said noble metal comprises platinum.

39. A ferroelectric capacitor comprising:

a first layer comprising a metal;

a second layer on said first layer, said second layer comprising a conductive metal oxide;

a third layer on said second layer opposite said first layer, said third layer comprising a ferroelectric material; and a fourth layer on and in direct contact with said third layer opposite said second layer, said fourth layer comprising said conductive metal oxide.

40. A ferroelectric capacitor according to claim 39 wherein said conductive metal oxide comprises one of ruthenium oxide, iridium oxide, lanthanum strontium cobalt oxide, indium tin oxide, or yttrium barium copper oxide.

41. A ferroelectric capacitor according to claim 39 wherein said metal comprises a noble metal.

42. A ferroelectric capacitor according to claim 39 wherein said noble metal comprises platinum.

43. A ferroelectric capacitor according to claim 39 wherein said ferroelectric material comprises lead zirconate titanate.

44. A ferroelectric capacitor according to claim 39 wherein said capacitor is included in an integrated circuit.

45. A ferroelectric capacitor according to claim 39 further comprising a substrate on said first layer opposite said second layer.

46. A ferroelectric capacitor according to claim 45 wherein said substrate comprises one of a silicon layer, a silicon dioxide layer, a magnesium oxide layer, a sapphire layer, a silicon carbide layer, a gallium arsenide layer, or a silicon dioxide layer on a silicon layer.

* * * * *